US009428829B2

(12) United States Patent
Cho et al.

(10) Patent No.: US 9,428,829 B2
(45) Date of Patent: Aug. 30, 2016

(54) METHOD FOR GROWING HIGH-QUALITY GRAPHENE LAYER

(71) Applicant: Korea Advanced Institute of Science and Technology, Daejeon (KR)

(72) Inventors: Byung Jin Cho, Daejeon (KR); Jeong Hun Mun, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 239 days.

(21) Appl. No.: 14/132,121

(22) Filed: Dec. 18, 2013

(65) Prior Publication Data
US 2014/0295080 A1 Oct. 2, 2014

(30) Foreign Application Priority Data

Mar. 26, 2013 (KR) ......................... 10-2013-0031902

(51) Int. Cl.
| C23C 16/26 | (2006.01) |
| C23C 16/40 | (2006.01) |
| C01B 31/04 | (2006.01) |
| C23C 14/02 | (2006.01) |

(52) U.S. Cl.
CPC ........... *C23C 16/26* (2013.01); *C01B 31/0453* (2013.01); *C23C 14/024* (2013.01); *C23C 14/025* (2013.01); *Y10T 428/30* (2015.01); *Y10T 428/31678* (2015.04)

(58) Field of Classification Search
CPC .................. H01L 29/1606; H01L 21/02645; H01L 45/1616; C23C 16/26; C23C 16/40
See application file for complete search history.

(56) References Cited

U.S. PATENT DOCUMENTS

| 9,129,811 | B2* | 9/2015 | Cho ................. H01L 21/02664 |
| 2011/0301111 | A1* | 12/2011 | Jackson ............... A61K 31/444 514/47 |
| 2013/0001515 | A1* | 1/2013 | Li ...................... H01L 21/0242 257/24 |
| 2013/0265567 | A1* | 10/2013 | Won ....................... G01N 21/59 356/51 |
| 2013/0287956 | A1 | 10/2013 | Patil |
| 2014/0218867 | A1* | 8/2014 | Kim ..................... H05K 9/0088 361/704 |

FOREIGN PATENT DOCUMENTS

| JP | 2009091174 A | 4/2009 |
| KR | 1020100107403 A | 10/2010 |
| KR | 1020120083864 A | 7/2012 |

(Continued)

OTHER PUBLICATIONS

Lee, Taemin, et al., "Layer-by-Layer Assembly for Graphene-Based Multilayer Nanocomposites: Synthesis and Applications". Chemistry of Materials, 2015, 27, 3785-3796.*

(Continued)

*Primary Examiner* — Bret Chen
(74) *Attorney, Agent, or Firm* — The Webb Law Firm

(57) ABSTRACT

A method of forming a high-quality graphene layer including forming a board layer; forming a stress reduction layer on the board layer; forming a metal catalyst layer on the stress reduction layer, the metal catalyst layer functioning as a catalyst for forming the graphene layer; and growing a graphene layer on the metal catalyst layer. The stress reduction layer reduces the stress of the metal thin film, thus, improving crystallinity and surface roughness of the metal thin film, and thereby effectively forming a high-quality graphene layer.

13 Claims, 6 Drawing Sheets

(56) References Cited

FOREIGN PATENT DOCUMENTS

KR    1020120111400 A    10/2012
WO       2011021715 A1    2/2011

OTHER PUBLICATIONS

Zhao, Yanyan, et al., "Well-Constructed Single-Layer Molybdenum Disulfide Nanorose Cross-Linked by Three Dimensional-Reduced Graphene Oxide Network for Superior Water Splitting and Lithium Storage Property". Scientific Reports, 5: 8722/ DOI: 10.1038/srep08722, pp. 1-10.*

Geim, A.K., et al., "The rise of graphene". Nature Materials, vol. 6, Mar. 2007, pp. 183-191.*

Balandin, Alexander A., et al., "Superior Thermal Conductivity of Single-Layer Graphene". Nano Letters 2008, vol. 8, No. 3, 902-907.*

* cited by examiner

US 9,428,829 B2

METHOD FOR GROWING HIGH-QUALITY GRAPHENE LAYER

CROSS-REFERENCE TO RELATED APPLICATIONS

This application claims priority to Korean Patent Application No. 10-2013-0031902 filed Mar. 26, 2013, the disclosure of which is hereby incorporated by reference in its entirety.

BACKGROUND OF THE INVENTION

1. Field of the Invention

The present invention relates to a board and method for forming a graphene layer, and more particularly, to a board for use in forming a graphene layer, which has a structure able to improve properties of the graphene layer formed thereon, and to a method of forming a high-quality graphene layer using the same.

2. Description of the Related Art

Graphene is a two-dimensional (2D) thin film resulting from planar arrangement of carbon atoms, and has a variety of advantages, including high electronic mobility, excellent mechanical strength, high transparency, etc. Furthermore, graphene may be currently manufactured using a processing technique such as deposition, etc., which is typically used, and is thus receiving attention as a next-generation material.

A graphene layer having the above properties is conventionally formed in such a manner that a silicon carbide (SiC) board is annealed at a high temperature in a high vacuum or that graphite oxide dispersed in a solvent is reduced. Recently, formation of a graphene layer using chemical vapor deposition (CVD) is mainly utilized due to its ability to form a graphene layer having a large area at low cost.

The method of forming a graphene layer using CVD is performed by exposing a catalyst metal such as nickel (Ni), copper (Cu), etc., to a high temperature in a gas atmosphere including a hydrocarbon such as methane ($CH_4$) or acetylene ($C_2H_2$) so that graphene is grown on a metal thin film, and this method facilitates growth of a desired layer on a large area and has low processing costs and is thus known to be the most appropriate in terms of commercialization among the methods of manufacturing graphene.

However, this method is problematic because, while grains of a metal thin film are grown in the course of high-temperature annealing for thermal decomposition of a hydrocarbon gas and formation of the graphene lattice of carbon, a deep grain boundary is formed and thus the surface of the metal thin film becomes very rough, which causes the quality of graphene formed on such a metal thin film to degrade. For example, in the case of a Ni metal thin film having a thickness of 300 nm, when it is annealed at 800° C. for growth of graphene, the depth of the grain boundary thereof may amount to 100 nm. Also, in the case where graphene in monolayer form with a thickness of less than 1 nm is grown on the metal thin film, bumpy shaped graphene is grown depending on the curvature of the surface of the metal thin film. When this graphene is transferred to a silicon wafer or a glass wafer, curvature formed along the grain boundary of the metal thin film is wrinkled while being pressed, undesirably deteriorating electrical properties of graphene.

As an alternative to decreasing the grain boundary of the metal thin film, a method of lowering a processing temperature is taken into consideration. However, when the processing temperature is lowered to decrease the grain growth of metal, the quality of graphene becomes poor. Hence, methods able to improve crystallinity of a metal thin film and decrease surface roughness thereof while not lowering the processing temperature should be ensured.

SUMMARY OF THE INVENTION

Accordingly, the present invention has been made keeping in mind the above problems encountered in the related art, and an object of the present invention is to provide a board having crystallinity and surface roughness suitable for growing a high-quality graphene layer so as to suppress grain growth from occurring in the course of annealing and induce efficient crystallization, and a method of forming a high-quality graphene layer using the same.

In order to accomplish the above object, an aspect of the present invention provides a board for forming a graphene layer, comprising a board layer; a metal catalyst layer disposed on the board layer and functioning as a catalyst for forming the graphene layer; and a stress reduction layer disposed between the board layer and the metal catalyst layer so as to reduce stress of the metal catalyst layer.

The stress reduction layer may comprise a layered material configured such that a compound having a 2D planar thin film structure of atoms formed by chemically strong bonding is provided in the form of a monolayer or a multilayer stack formed by weak bonding, and the layered material may be any one selected from among graphene, reduced graphite oxide, molybdenum disulfide ($MoS_2$) and molybdenum diselenide ($MoSe_2$). Also, the stress reduction layer may comprise an adhesion reducing material for reducing adhesion of the metal catalyst layer to the board layer.

Furthermore, the board layer may not react with the metal catalyst layer and may thus form no compound.

As such, the board layer may comprise a substrate layer and a reaction barrier layer formed on the substrate layer so as to prevent generation of a compound between the substrate layer and the metal catalyst layer, and the substrate layer may comprise any one selected from among silicon (Si), germanium (Ge) and silicon germanium (SiGe), or may comprise silicon on insulator (SOI). The reaction barrier layer may comprise any one selected from among Si oxide, Hf oxide, Zr oxide, Al oxide, La oxide, Ti oxide, W oxide, Co oxide, Ta oxide, Ni oxide, Mo oxide, V oxide and Cr oxide.

Also, the board layer may comprise any one selected from among glass, quartz and sapphire.

Furthermore, the metal catalyst layer may comprise any one selected from among nickel (Ni), copper (Cu), platinum (Pt), ruthenium (Ru), rhodium (Rh), gold (Au), tungsten (W), cobalt (Co), palladium (Pd), titanium (Ti), tantalum (Ta), molybdenum (Mo), hafnium (Hf), lanthanum (La), iridium (Ir) and silver (Ag).

Another aspect of the present invention provides a method of forming a graphene layer, comprising (a) forming a board layer; (b) forming a stress reduction layer on the board layer; (c) forming a metal catalyst layer which functions as a catalyst for forming the graphene layer; and (d) growing the graphene layer on the metal catalyst layer, wherein the stress reduction layer reduces stress of the metal catalyst layer.

As such, the stress reduction layer may comprise a layered material configured such that a compound having a 2D planar thin film structure of atoms formed by chemically strong bonding is provided in the form of a monolayer or a multilayer stack formed by weak bonding, and the layered material may be any one selected from among graphene, reduced graphite oxide, molybdenum disulfide ($MoS_2$) and molybdenum diselenide ($MoSe_2$).

Also, the stress reduction layer may comprise an adhesion reducing material for reducing adhesion of the metal catalyst layer to the board layer.

Also, forming the board layer in (a) may comprise (a1) forming a substrate layer for supporting a series of layers stacked thereon; and (a2) forming a reaction barrier layer on the substrate layer so as to prevent generation of a compound between the substrate layer and the metal catalyst layer.

Furthermore, growing the graphene layer in (d) may be performed using CVD.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

The present invention may be modified variously and may have a variety of embodiments, and below is a detailed description of specific embodiments with reference to the appended drawings.

In the following description, it is noted that, when the detailed description of known techniques related with the present invention may make the gist of the present invention unclear, a detailed description thereof will be omitted.

Further, in the following description, the terms "first", "second" and the like may be used to explain various elements, and are used to differentiate a certain element from other elements, but the configuration of such elements should not be construed to be limited by the terms.

Because the reason why the surface of a metal thin film is roughened in the related art is regarded as stress induced grain growth due to the stress of the metal thin film, a stress reduction layer able to decrease stress of the metal thin film is used in the present invention.

Figure 1:
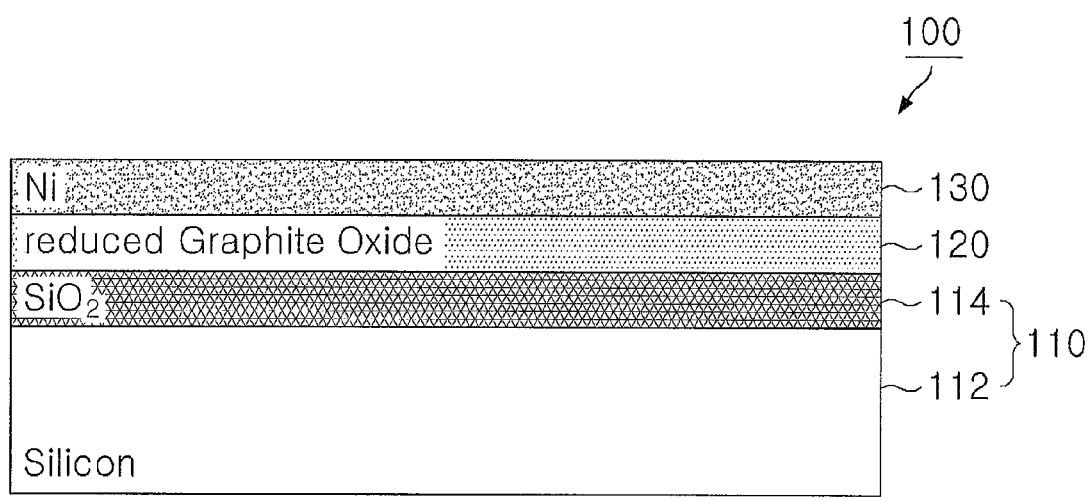
FIG. 1 is a schematic view illustrating the configuration of a board for forming a graphene layer according to an embodiment of the present invention.

FIG. 1 illustrates the configuration of a board 100 for forming a graphene layer according to an embodiment of the present invention. With reference to FIG. 1, the board 100 for forming a graphene layer according to the embodiment of the present invention is configured such that a board layer 110 is provided and a stress reduction layer 120 and a metal catalyst layer 130 are sequentially stacked thereon.

As such, graphene refers to a 2D thin film comprising a monolayer of carbon atoms arranged in a hexagonal network, and a graphene layer indicates a layer which is composed of graphene and is formed on a board via a series of processes.

In the case where the board layer 110 reacts with the metal catalyst layer 130 and thus forms a compound such as metal silicide or the like, the surface roughness of the metal catalyst layer 130 and the properties of the graphene layer may become poor. Hence, it is preferred that the board layer 110 does not react with the metal catalyst layer 130 and thus any compound is not formed therebetween. The board layer 110 may include a substrate layer 112 and a reaction barrier layer 114 formed thereon, and the board layer 110 may be formed of a material such as glass, quartz or sapphire, which does not react with the metal catalyst layer 130.

Furthermore, the board layer 110 or the substrate layer 112 may be formed of a flexible material. As such, the flexible material refers to a substrate having properties to the extent that it is considerably curvable or bendable, unlike general boards. Currently available examples thereof include polyimide (PI), polyester (PET), thin glass, a glass fiber sheet, etc.

In the case where the board layer 110 includes the substrate layer 112 and the reaction barrier layer 114, the substrate layer 112 may be formed of silicon (Si) and the reaction barrier layer 114 may be an oxide layer 114. The material for the substrate layer 112 may include germanium (Ge), silicon germanium (SiGe) or silicon on insulator (SOI), other than silicon, as required.

As the reaction barrier layer, the oxide layer 114 may be formed using a process such as thermal oxidation, deposition, etc., and may be made using Si oxide, Hf oxide, Zr oxide, Al oxide, La oxide, Ti oxide, W oxide, Co oxide, Ta oxide, Ni oxide, Mo oxide, V oxide, Cr oxide, etc. The reaction barrier layer is not necessarily limited to the oxide layer, and the other material such as a nitride layer, etc. may be used so long as it prevents the reaction between the substrate layer 112 and the metal catalyst layer 130.

The stress reduction layer 120 is formed of a material able to decrease adhesion between the metal catalyst layer 130 and the board layer 110, and functions to decrease stress of the metal catalyst layer 130 which may incur problems in the course of deposition and annealing. The material for the stress reduction layer 120 may include a layered material. As such, the layered material refers to a material configured such that a compound having a 2D planar thin film structure of atoms formed by chemically strong bonding is provided in the form of a monolayer or a multilayer stack formed by weak bonding. Herein, strong bonding may be a bond in which its equilibrium state may break only in the presence of a considerable amount of external energy, and may include chemical bonds, such as covalent bonds, metallic bonds, ionic bonds, etc., and weak bonding may be a bond in which its equilibrium state may break easily in the presence of a small amount of external energy, and may include a Van der Waals bond, etc.

In the case where the stress reduction layer 120 is formed of the layered material, the layered material may form, depending on the direction of the planar structure thereof, strong chemical bonding such as a covalent bond, etc. in a parallel direction, and weak bonding such as a Van der Waals bond, etc. in a perpendicular direction. Hence, as bonding of the stress reduction layer to the upper metal catalyst layer 130 by the lower board layer 110 becomes weak, adhesion energy thereof may also decrease. Accordingly, stress of the metal catalyst layer 130, which may be induced or increased by the board layer 110, is decreased, thereby reducing stress induced grain growth due to the stress of the metal catalyst layer 130. Examples of the layered material useful in the present invention may include graphene, reduced graphite oxide, molybdenum disulfide ($MoS_2$), molybdenum diselinide ($MoSe_2$), etc.

Also, the stress reduction layer 120 may be formed of an adhesion reducing material which reduces the adhesion of one medium to another adjacent medium, in addition to the layered material, and the adhesion reducing material may be exemplified by an adhesion reducer such as ADEPT, ETHICON360, etc.

The stress reduction layer 120 is formed in such a manner that the stress reduction layer 120 is directly formed on the board layer 110 or that the stress reduction layer 120 is separately formed and then transferred to the top of the board layer 110. In particular, because the stress reduction layer 120 functions to reduce stress of the metal catalyst layer 130 which may be induced by the board layer 110, its thickness need not be high, and thus the direct formation of the stress reduction layer 120 on the board layer 110 is favorable. In this case, it is possible to comparatively simply form the stress reduction layer 120 by subjecting reduced graphite oxide to spin coating. The thickness of the stress reduction layer 120 may be set to about 10 nm so long as the stress reduction layer 120 is made of graphene, but is not limited thereto and is determined depending on the materials of the board layer 110 and the metal catalyst layer 130, processing conditions of annealing and so on, properties of the material of the stress reduction layer 120, etc.

The metal catalyst layer 130 may be provided in the form of a metal thin film using a process such as deposition, etc., and functions as a catalyst for forming the graphene layer. In the case where the graphene layer is formed using CVD according to an embodiment of the present invention, catalysis of the metal catalyst layer is as follows. Specifically, the metal thin film is heated to a high temperature under normal pressure in a hydrocarbon atmosphere, so that the hydrocarbon gas is thermally decomposed, and the thermally decomposed carbon atoms are fused in the metal thin film and then cooled, whereby the oversaturated carbon atoms are segregated to the surface of the metal thin film, thus forming the graphene layer on the metal thin film layer. The metal for the metal catalyst layer 130 may include nickel (Ni), copper (Cu), platinum (Pt), ruthenium (Ru), rhodium (Rh), gold (Au), tungsten (W), cobalt (Co), palladium (Pd), titanium (Ti), tantalum (Ta), molybdenum (Mo), hafnium (Hf), lanthanum (La), iridium (Ir), silver (Ag), etc., each of which has crystallinity able to form graphene.

Figure 2:
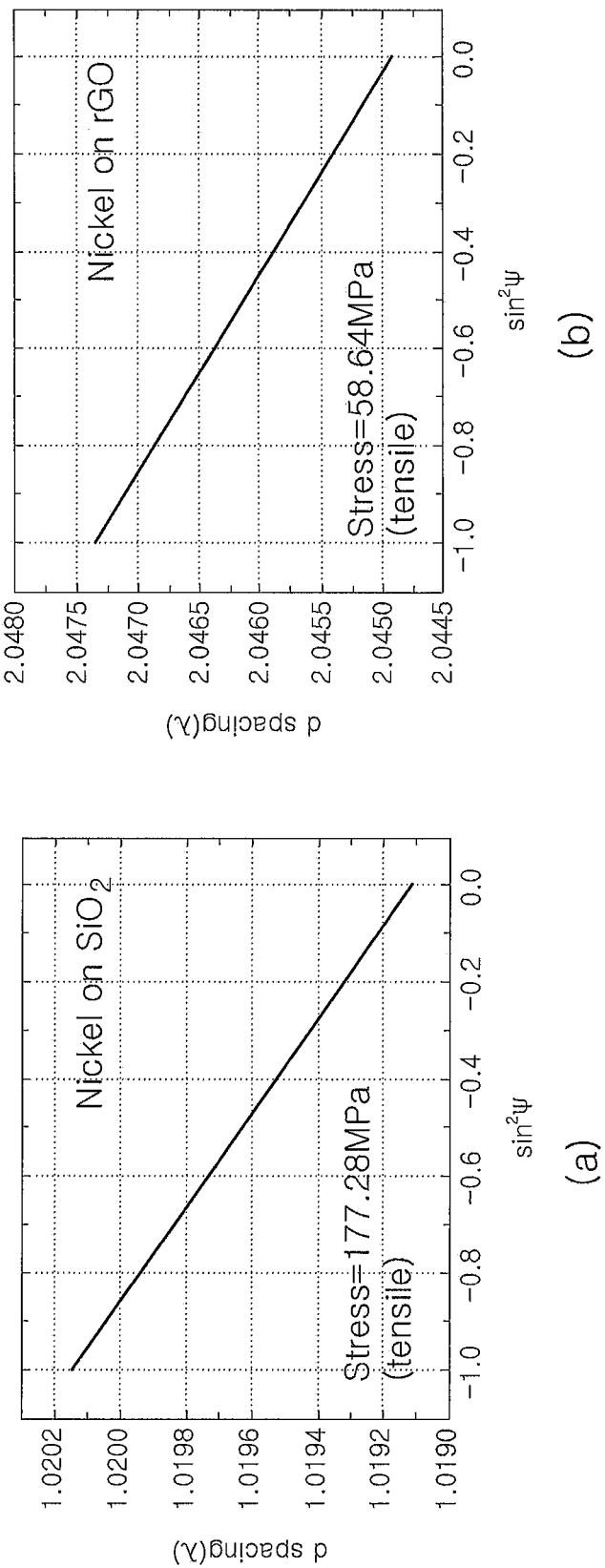
FIGS. 2A and 2B are graphs illustrating the results of measurement of the stress level of a metal catalyst layer due to the insertion of a stress reduction layer.
Figure 3:
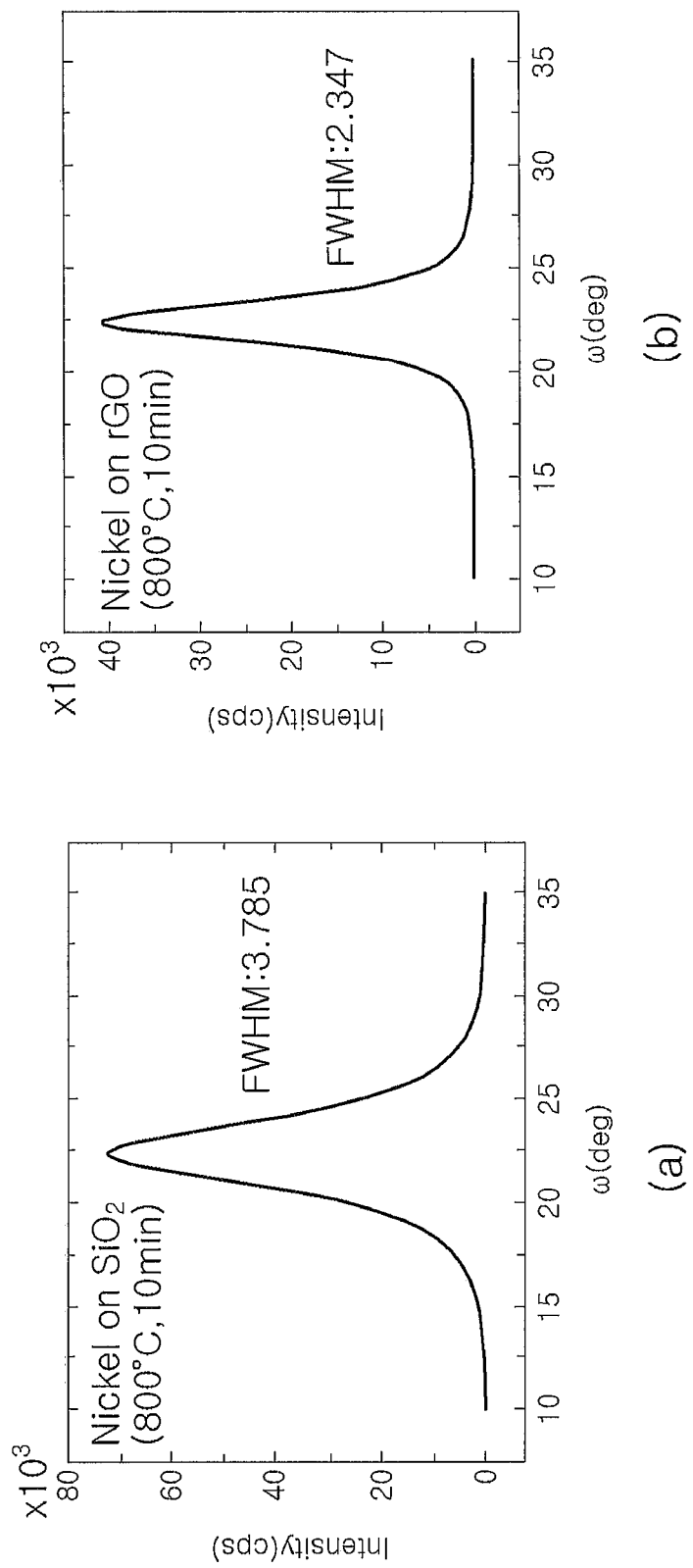
FIGS. 3A and 3B are graphs illustrating the rocking curve for evaluating the crystallinity of a metal catalyst layer due to the insertion of a stress reduction layer.
Figure 4:
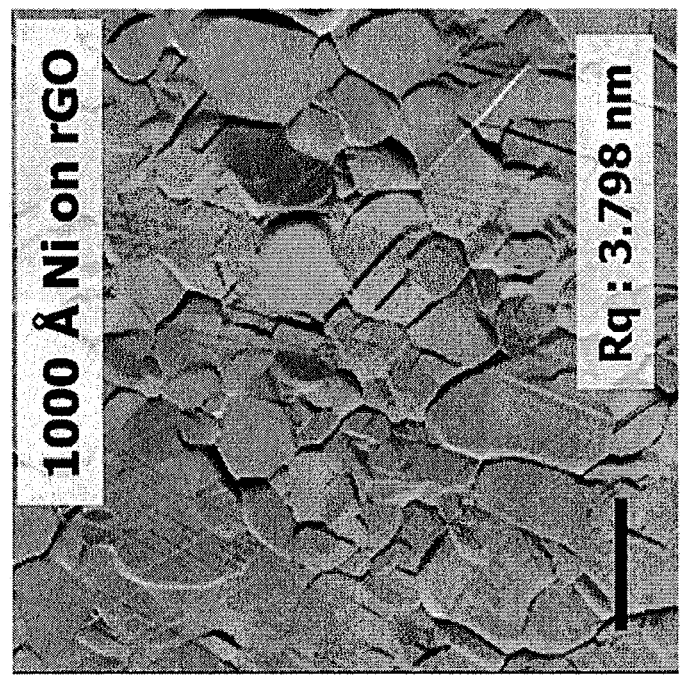
FIGS. 4A and 4B are atomic force microscope images illustrating the surface height and surface roughness (RMS roughness) of a metal catalyst layer due to the insertion of a stress reduction layer.
Figure 4:
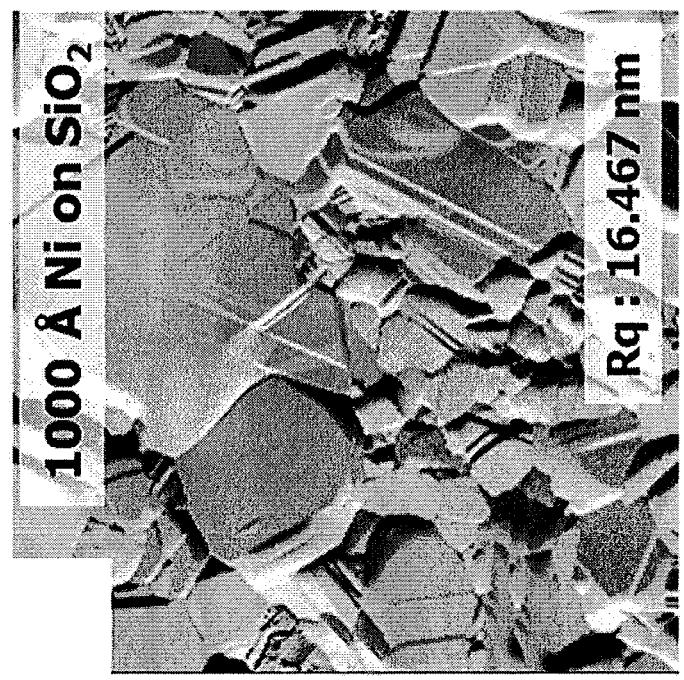
Figure 4:
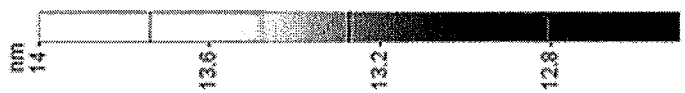
Figure 5:
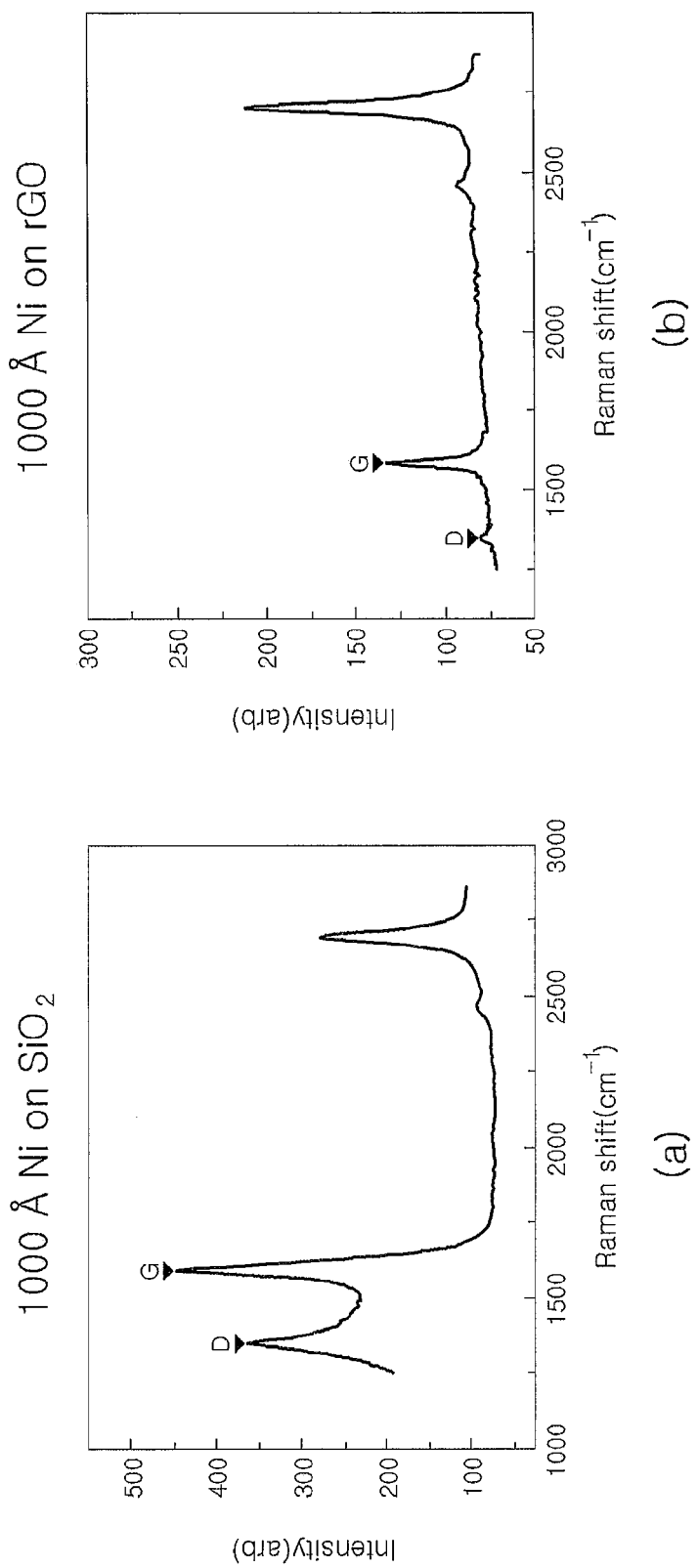
FIGS. 5A and 5B are graphs illustrating Raman spectra for evaluating the quality of the graphene layer transferred to a silicon ($SiO_2$/Si) wafer.

FIGS. 2A and 2B illustrate the results of measurement of the stress level of the metal catalyst layer 130 after annealing of the board 100 for forming a graphene layer according to an embodiment of the present invention.

In order to evaluate the quality of the board 100 for forming a graphene layer according to an embodiment of the present invention, a test board is manufactured in such manner that the substrate layer 112 is formed of silicon (Si), the oxide layer 114 is formed to a thickness of 300 nm via thermal oxidation of silicon dioxide ($SiO_2$), the stress reduction layer 120 is formed to a thickness of 10 nm on the oxide layer 114 via spin coating using reduced graphite oxide, and the metal catalyst layer 130 is formed to a thickness of 100 nm on the stress reduction layer 120 via evaporation using Ni. The board thus manufactured is used as each measurement sample of FIGS. 2A and 2B to 5A and 5B, and 6.

The manufactured board is annealed at about 800° C., for 10 min, which is enough to grow high-quality graphene on the Ni metal thin film. The board having no stress reduction layer 120 is also annealed under the same conditions as above, and the stress level after annealing is measured using an omega method through X-ray diffraction.

As is apparent from the results of measurement of stress of the metal thin film in the case where Ni is formed on the oxide layer 114 comprising $SiO_2$ without the stress reduction layer 120 (FIG. 2A) and in the case where the stress reduction layer 120 is inserted (FIG. 2B), tensile stress is measured to be 177.28 MPa in the former case, and is measured to be 58.64 MPa in the latter case using the stress reduction layer 120, from which the tensile stress of the metal thin film can be seen to be decreased to ⅓ due to the insertion of the stress reduction layer 120.

FIGS. 3A and 3B are graphs illustrating the rocking curve for evaluating crystallinity of the metal catalyst layer 130 due to the insertion of the stress reduction layer 120. FIG. 3A illustrates the case having no stress reduction layer 120, the full width half maximum (FWHM) of which is 3.785. FIG. 3B illustrates the case having the stress reduction layer 120, the FWHM of which is 2.347. Accordingly, as the stress reduction layer 120 reduces the adhesion energy between the metal catalyst layer 130 and the oxide layer 114, the metal catalyst layer 130 is ensured in terms of the degree of freedom of movement of atoms therein during annealing and thus has improved crystallinity.

FIGS. 4A and 4B are atomic force microscope images illustrating the surface height and RMS roughness of the metal catalyst layer 130 due to the insertion of the stress reduction layer 120. In order to evaluate the effect of low stress ensured by the insertion of the stress reduction layer 120 on the metal thin film, the surface of the metal thin film is measured using atomic force microscopy. When comparing the results of measurement of the case having no stress reduction layer 120 (FIG. 4A) and the results of measurement of the case having the stress reduction layer 120 (FIG. 4B), stress induced grain growth can be seen to be suppressed due to the insertion of the stress reduction layer 120, resulting in grains having a small size. Thereby, in the case where the stress reduction layer 120 is inserted, formation of the grain boundary is inhibited, and thus the RMS roughness of the metal catalyst layer 130 is measured to be 3.798 nm, which is very low corresponding to ⅕ level of 16.467 nm of the case having no stress reduction layer 120.

FIGS. 5A and 5B are graphs illustrating Raman spectra of the graphene layer transferred to a silicon wafer having grown $SiO_2$ with a thickness of 300 nm, in order to evaluate whether superior crystallinity and surface roughness of the metal catalyst layer 130 resulting from the insertion of the stress reduction layer 120 have an influence on the quality of the graphene layer formed thereon. FIG. 5A illustrates the results of measurement of the case having no stress reduction layer 120, and FIG. 5B illustrates the results of measurement of the case having the stress reduction layer 120. When comparing these measurement results, it can be seen that the quality of graphene is improved thanks to the insertion of the stress reduction layer 120, and also that the quality of the formed graphene layer is very good based on the ratio of the D band and the G band in FIG. 5B.

Figure 6:
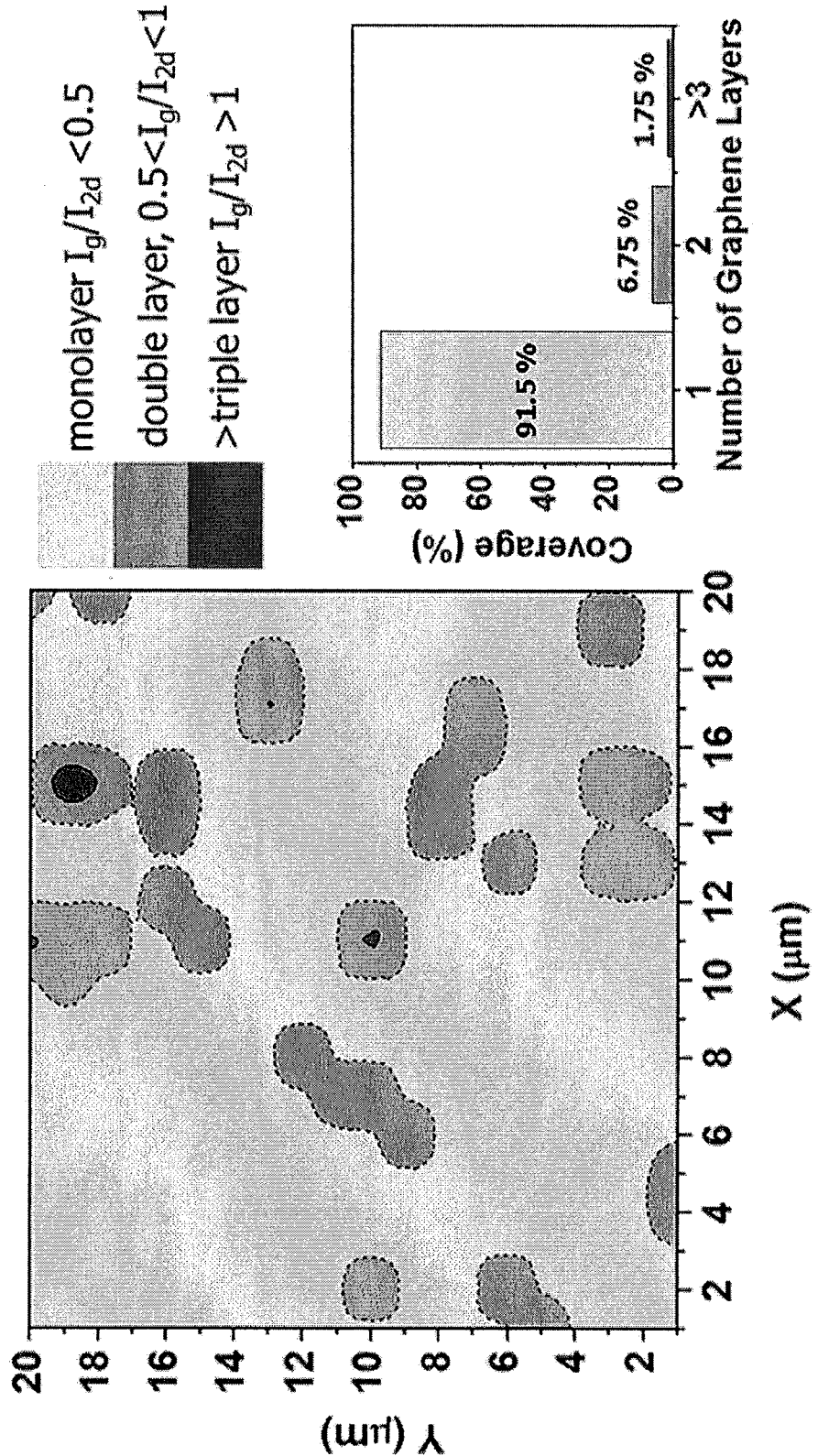
FIG. 6 is a graph illustrating 2D Raman mapping of layer uniformity of the graphene layer transferred to a silicon ($SiO_2$/Si) wafer.

FIG. 6 is a graph illustrating 2D Raman mapping of layer uniformity of the graphene transferred to a silicon ($SiO_2$/Si) wafer, in order to evaluate layer uniformity due to the insertion of the stress reduction layer 120.

Typically, graphene grown on Ni is known to have poor layer uniformity and high thickness. This is because a large amount of carbon may be dissolved in Ni owing to high carbon solid solubility of Ni, and there is a large difference in carbon diffusivity between the grain boundary and the inside of grains, and thus a large amount of carbon is segregated at the grain boundary of Ni.

However, in the case where the stress reduction layer 120 is inserted according to the present invention, crystallinity and surface roughness of the metal catalyst layer 130 may be improved. Therefore, as seen in FIG. 6, the 2D Raman mapping results of graphene grown on the metal catalyst layer 130 made of Ni according to an embodiment of the present invention show that 91.5% of the surface thereof is a monolayer, resulting in very superior layer uniformity.

As described hereinbefore, the present invention provides a board and method for forming a high-quality graphene layer. According to the present invention, a stress reduction layer able to reduce stress of a metal thin film is formed, thereby improving crystallinity and surface roughness of the metal thin film, ultimately forming a high-quality graphene layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Thus, the embodiments of the present invention do not limit the spirit of the invention but are construed to explain it. Furthermore, it is to be understood that the scope of protection of the invention is set forth by the following claims, and all the technical ideas within the range equivalent thereto are incorporated into the scope of the invention.

What is claimed is:

1. A method of forming a graphene layer, comprising, in the following order:
   (a) forming a board layer;
   (b) forming a stress reduction layer on the board layer;
   (c) forming a metal catalyst layer on the stress reduction layer, the metal catalyst layer functioning as a catalyst for forming the graphene layer; and
   (d) growing the graphene layer on the metal catalyst layer, wherein the stress reduction layer reduces stress of the metal catalyst layer.

2. The method of claim 1, wherein the stress reduction layer comprises a layered material configured such that a compound having a two-dimensional planar thin film structure of atoms formed by chemically strong bonding is provided in a form of a monolayer or a multilayer stack formed by weak bonding.

3. The method of claim 2, wherein the layered material is any one selected from among graphene, reduced graphite oxide, molybdenum disulfide ($MoS_2$) and molybdenum diselenide ($MoSe_2$).

4. The method of claim 3, wherein forming the board layer in (a) comprises:
   (a1) forming a substrate layer for supporting a series of layers stacked thereon; and
   (a2) forming a reaction barrier layer on the substrate layer so as to prevent generation of a compound between the substrate layer and the metal catalyst layer.

5. The method of claim 2, wherein forming the board layer in (a) comprises:
   (a1) forming a substrate layer for supporting a series of layers stacked thereon; and
   (a2) forming a reaction barrier layer on the substrate layer so as to prevent generation of a compound between the substrate layer and the metal catalyst layer.

6. The method of claim 1, wherein the stress reduction layer comprises an adhesion reducing material for reducing adhesion of the metal catalyst layer to the board layer.

7. The method of claim 6, wherein forming the board layer in (a) comprises:
   (a1) forming a substrate layer for supporting a series of layers stacked thereon; and
   (a2) forming a reaction barrier layer on the substrate layer so as to prevent generation of a compound between the substrate layer and the metal catalyst layer.

8. The method of claim 1, wherein forming the board layer in (a) comprises:
   (a1) forming a substrate layer for supporting a series of layers stacked thereon; and
   (a2) forming a reaction barrier layer on the substrate layer so as to prevent generation of a compound between the substrate layer and the metal catalyst layer.

9. The method of claim 1, wherein growing the graphene layer in (d) is performed using chemical vapor deposition.

10. The method of claim 1, wherein the board layer comprises a substrate layer and a reaction barrier layer formed on the substrate layer such that the board layer does not react with the metal catalyst layer and no compound is formed between the substrate layer and the metal catalyst layer and the substrate layer comprises any one selected from the group consisting of silicon (Si), germanium (Ge) and silicon germanium (SiGe), or comprises silicon on insulator (SOI).

11. The method of claim 1, wherein the board layer comprises a substrate layer and a reaction barrier layer formed on the substrate layer such that the board layer does not react with the metal catalyst and no compound is formed between the substrate layer and the metal catalyst layer and the reaction barrier layer comprises any one selected from the group consisting of Si oxide, Hf oxide, Zr oxide, Al oxide, La oxide, Ti oxide, W oxide, Co oxide, Ta oxide, Ni oxide, Mo oxide, V oxide, and Cr oxide.

12. The method of claim 1, wherein the board layer does not react with the metal catalyst layer and, thus, forms no compound and the board layer comprises any one selected from the group consisting of glass, quartz, and sapphire.

13. The method of claim 1, wherein the metal catalyst layer comprises any one selected from the group consisting of nickel (Ni), copper (Cu), platinum (Pt), ruthenium (Ru), rhodium (Rh), gold (Au), tungsten (W), cobalt (Co), palladium (Pd), titanium (Ti), tantalum (Ta), molybdenum (Mo), hafnium (Hf), lanthanum (La), iridium (Ir), and silver (Ag).

* * * * *